US007443238B2

(12) United States Patent
Laaser

(10) Patent No.: US 7,443,238 B2
(45) Date of Patent: Oct. 28, 2008

(54) AMPLIFIER STAGE, OPERATIONAL AMPLIFIER AND METHOD FOR AMPLIFYING A SIGNAL

(75) Inventor: Peter Laaser, München (DE)

(73) Assignee: Infineon Technologies AG, Munich (DE)

( * ) Notice: Subject to any disclaimer, the term of this patent is extended or adjusted under 35 U.S.C. 154(b) by 99 days.

(21) Appl. No.: 11/501,266

(22) Filed: Aug. 9, 2006

(65) Prior Publication Data
US 2008/0024218 A1 Jan. 31, 2008

(30) Foreign Application Priority Data
Jul. 26, 2006 (DE) ........................ 10 2006 034 560

(51) Int. Cl.
*H03F 3/45* (2006.01)
(52) U.S. Cl. ....................................... 330/253; 330/257
(58) Field of Classification Search ................ 330/253, 330/257, 254, 261
See application file for complete search history.

(56) References Cited

U.S. PATENT DOCUMENTS

| 3,979,689 | A | | 9/1976 | Schade, Jr. | |
|---|---|---|---|---|---|
| 4,728,900 | A | * | 3/1988 | Nakagawara et al. | ....... 330/253 |
| 6,316,998 | B1 | * | 11/2001 | Oikawa | ...................... 330/255 |
| 6,538,632 | B1 | * | 3/2003 | Yamazaki et al. | ............. 345/98 |
| 7,279,974 | B2 | * | 10/2007 | Rowley | ...................... 330/253 |

FOREIGN PATENT DOCUMENTS

DE 100 21 928 A1 11/2001

OTHER PUBLICATIONS

"Low Voltage Analog Circuit Design Techniques: A Tutorial", S. Yan and Sanchez-Sinencio, IEICE Trans. Analog Integrated Circuits and Systems, vol. E00-A, No. 2, Feb. 2000, Invited Paper, pp. 11-12.

* cited by examiner

*Primary Examiner*—Robert J. Pascal
*Assistant Examiner*—Alan Wong
(74) *Attorney, Agent, or Firm*—Eschweiler & Associates, LLC

(57) ABSTRACT

An amplifier stage includes a first and a second signal path having a series connection of a first transistor of a first conduction type which forms a control input for receiving an input signal to the amplifier stage and a second transistor of a second conduction type. The amplifier stage further includes a first and second signal output which are formed by a respective connection node of the respective first and second transistors. For each of the first and the second signal path, the amplifier stage includes a third transistor of the second conduction type which is connected to the respective second transistor as current mirror, and a fourth transistor of the first conduction type which is connected to the respective first transistor as a current mirror and which is for controlling the third transistor of the other signal path, respectively. Furthermore, for each of the first and the second signal path, a current source is provided with is connected in parallel to one of the respective first, second, third, and fourth transistors.

19 Claims, 5 Drawing Sheets

AMPLIFIER STAGE, OPERATIONAL AMPLIFIER AND METHOD FOR AMPLIFYING A SIGNAL

REFERENCE TO RELATED APPLICATIONS

This application claims the benefit of the priority date of German application DE 10 2006 034 560.6, filed on Jul. 26, 2006, the contents of which are herein incorporated by reference in their entirety.

FIELD OF THE INVENTION

The invention relates to an amplifier stage and an operational amplifier with the amplifier stage. The invention further relates to a method for amplifying a signal.

BACKGROUND OF THE INVENTION

Operational amplifiers usually comprise an input stage and at least one output stage, which is often configured as a class A stage. In this case, the quiescent current in the output stage basically corresponds to the maximum output current. Especially for signals with a high crest factor, that means with a high ratio between a peak value and a root mean square value of the electrical alternating signal, a class A mode of operation results in a high current consumption and therefore in a low efficiency of the amplifier stage or the operational amplifier respectively.

In systems for mobile communication, circuit blocks with operational amplifiers in a receiving path are in a so-called listen mode with a high probability, depending on the used mobile communication system. In this case, the circuit blocks with operational amplifiers are active but do not receive a signal and therefore are not provided with an input signal. Especially for amplifiers with a class A mode of operation this leads to a high current consumption and a low efficiency.

FIG. 9 shows an exemplary embodiment of a conventional class A output stage which, for example, can be used in a Miller operational amplifier. The amplifier stage comprises two signal paths with respective NMOS transistors NB1, NB2, and PMOS transistors PB1, PB2 connected in series. An input INP, INM of the amplifier stage is formed by the control input of the transistors NB1, NB2. The signal paths are connected between a supply voltage tap VDD and a reference voltage tap GND. Taps OUTM and OUTP which are connected between the NMOS transistors NB1, NB2 and the PMOS transistors PB1, PB2, respectively, provide the amplified output signal. A quiescent current through the PMOS transistors PB1, PB2 is controlled by a reference transistor P0 which is connected to the PMOS transistors PB1, PB2 as a current mirror and which is coupled to a reference current input IB for receiving a reference current. The quiescent current corresponds also to the maximum output current of a signal path. The current value depends on a current mirror ratio between the transistors PB1, PB2 and the transistor PB0. By providing an input signal to the input taps INP, INM, for example by a pre-stage or input stage, the current through the signal paths and therefore an output signal at the output OUTM, OUTP is influenced. As mentioned before, the high quiescent current also flows for input signals with small or even no amplitude.

As an alternative, several class AB amplifier stages can be used instead of the shown class A amplifier stage as an output stage. There are different class AB output stages known which comprise a negative feedback or get by without a negative feedback.

Class AB output stages without a negative feedback usually comprise additional parasitic capacitances for the output transistors which reduces the frequency bandwidth of the amplifier stage substantially. Furthermore, an additional current and area consumption of current paths for adjusting a control voltage of the output transistors have an undesired effect in case of a quiescent current mode.

On the other hand, class AB output stages with negative feedback require high bandwidths for the feedback circuit. This again results in a high current consumption.

For applications with very strict requirements regarding a frequency bandwidth, for example wireless local area network, WLAN, e.g. according to 802.11n, it is therefore necessary to increase the current consumption for compensation of bandwidth loss so much that this does not result in a noteworthy advantage regarding the current consumption compared to conventional class A output stages. For this reason, for applications with strict requirements regarding the frequency bandwidth, almost solely class A operational amplifiers are used, that means operational amplifiers with a class A output stage.

It is therefore not known for operational amplifiers to achieve a low current consumption, neither with class A nor with class AB output stages, especially for a quiescent current mode, without reducing a possible output power or a possible frequency bandwidth.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present one or more concepts of the invention in a simplified form as a prelude to the more detailed description that is presented later.

An amplifier stage comprises a first and a second signal path, each comprising a series connection of a first transistor of a first conduction type which comprises a control input configured to receive an input signal to the amplifier stage and a second transistor of a second conduction type. In one embodiment the first and the second signal paths are each connected between a supply voltage tap and a reference voltage tap. A first and a second signal output form at a respective connection node of the respective first and second transistors in the first and second paths, respectively. A third transistor of the second conduction type is connected to the respective second transistor as a current mirror in each of the first and second paths, and a fourth transistor of the first conduction type is connected to the respective first transistor as a current mirror and is configured to control the third transistor of the other signal path respectively in each of the first and second paths. A current source is connected in parallel to one of the respective first, second, third and fourth transistors in each of the first and second paths.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

The text below explains the invention in detail using exemplary embodiments with reference to the drawings in which.

DETAILED DESCRIPTION OF THE INVENTION

In an exemplary embodiment of the invention, an amplifier stage comprises a first and a second signal path, each comprising a series connection of a first transistor of a first conduction type which comprises a control input for providing an input signal to the amplifier stage, and a second transistor of a second conduction type. The first and the second signal paths are connected between a supply voltage tap and a reference voltage tap. A first and a second signal output are formed by a respective connection node of the respective first and second transistors.

Furthermore, for each of the first and the second signal path, a third transistor of the second conduction type is provided which is connected to the respective second transistor as a current mirror. The amplifier stage comprises for each of the first and the second signal path a fourth transistor of the first conduction type which is connected to the respective first transistor as a current mirror and which is for controlling the third transistor of the other signal path, respectively. In addition, for each of the first and the second signal path, a current source is connected in parallel to one of the respective first, second, third, and fourth transistors.

According to one embodiment of the invention, a current in a first and a second signal path is, for example, controlled by providing a differential input signal to the respective first transistors. The controlled current is scaled down in a first and a second auxiliary current path by a first factor. The respective second transistors for one of the first and the second signal path are controlled in such a manner that the scaled-down current in the auxiliary current path of the respective other one of the signal paths is scaled up by a second factor which is different from the first factor. The different factors are balanced by providing a balancing current to the first and the second signal path or to the first and the second auxiliary current path. This can be done using a respective current source, for example. A differential output signal can be provided depending on the controlled current.

As a balancing current is provided by the additional current sources, a quiescent current in a signal path also depends on the balancing currents, that means when the respective first transistors are not provided with an input signal. If the current mirrors and the additional current sources are dimensioned accordingly, a low current consumption of the amplifier circuit can be achieved, especially for the quiescent current mode, while a high frequency bandwidth can be achieved with the amplifier stage nevertheless.

Figure 1:
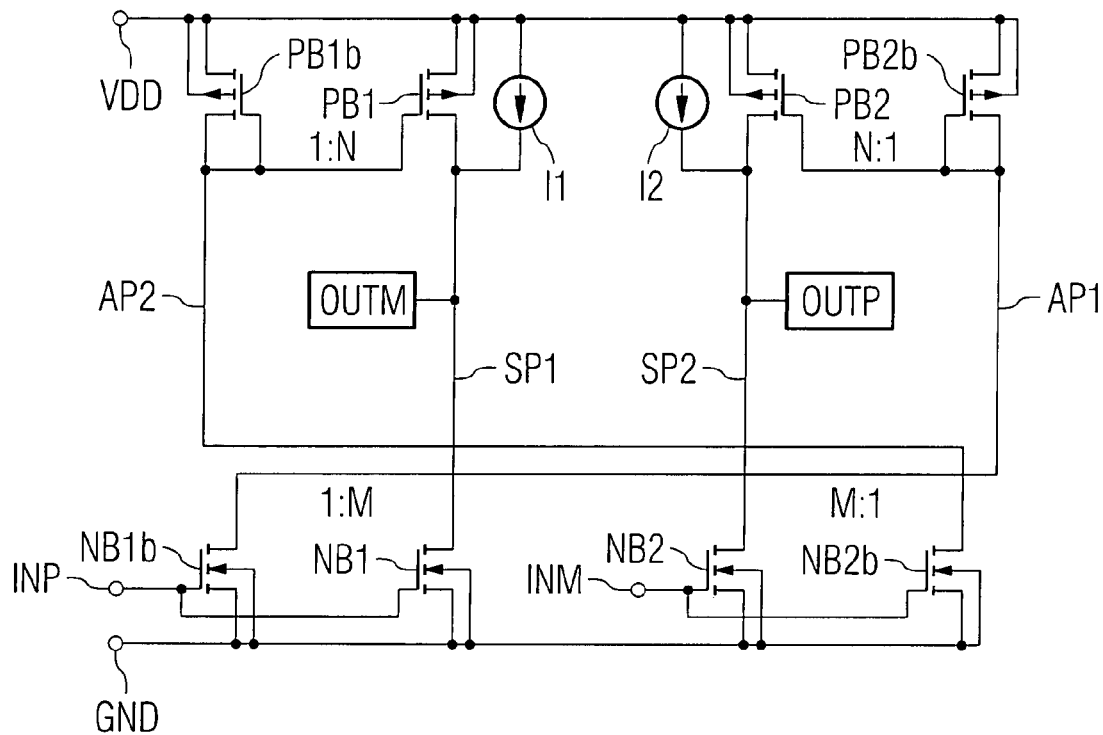
FIG. 1 is a schematic diagram illustrating a first exemplary embodiment of an amplifier stage according to the invention.

FIG. 1 shows an exemplary embodiment of an amplifier stage according to the invention which comprises a first and a second signal path SP1, SP2. Each of the signal paths SP1, SP2 comprises a series connection of an NMOS transistor NB1, NB2 and a PMOS transistor PB1, PB2. The signal paths SP1, SP2 are connected between a supply voltage tap VDD and a reference voltage tap GND. Output taps OUTM, OUTP of the amplifier stage are provided at the respective connection node of the transistors NB1, PB1 and NB2, PB2.

Furthermore, third transistors NB1$b$, NB2$b$ are provided, respectively, as current mirror transistors for forming a respective current mirror with the transistors NB1, NB2. For this reason, the transistors NB1, NB1$b$ and NB2, NB2$b$ are connected, respectively, by their source and their gate or control input, respectively. The control inputs of the transistors NB1, NB2 also form a signal input INP, INM of the amplifier stage for providing a differential input signal.

Also the second transistors PB1, PB2 are coupled to a current mirror transistor PB1$b$, PB2$b$, respectively, and form further current mirrors with them. The upper current mirror PB2, PB2$b$ of the second signal path SP2 is coupled to an output of the lower current mirror transistor NB1$b$ of the first signal path SP1 over a first auxiliary current path AP1. In the same way, the upper current mirror PB1, PB1$b$ of the first signal path SP1 is coupled to the lower current mirror transistor NB2$b$ of the second signal path SP2 by a second auxiliary current path AP2.

In other words, a respective upper current mirror of one signal path of the assemblage of the first and the second signal path, respectively, is coupled to the lower current mirror of the other signal path of the assemblage of the first and second signal path, respectively.

A current source I1 is provided in parallel to the second transistor PB1 of the first signal path SP1. A constant current can be fed into the first signal path SP1 by the current source I1. Accordingly, a second current source I2 is provided in the second signal path SP2 in parallel to the second transistor PB2 which can feed a current into the second signal path SP2. The current sources I1, I2 are formed as constant current sources, for example, and are usually dimensioned in such a manner that they each supply a current of the same value.

The transistors NB1, NB1$b$ and NB2, NB2$b$ of the first and the second signal path SP1, SP2 in this embodiment are dimensioned in such a manner that a current through the respective first transistor NB1, NB2 is larger than a current through the respective fourth transistor or current mirror transistor NB1$b$, NB2$b$ by a first factor M. In this way, a current through the respective first transistor NB1, NB2 can be scaled down by a first factor M so that a current through the current mirror transistors NB1$b$, NB2$b$ and the first and the second auxiliary current paths AP1, AP2 flow as respective scaled down currents.

The transistors of the upper current mirrors PB2, PB2$b$ and PB1, PB2$b$ can be dimensioned likewise in a determined way such that a current through the respective second transistors PB1, PB2 is larger than a current through the respective current mirror transistor PB1$b$, PB2$b$ by a second factor N.

The first and the second factor M, N correspond to the respective current mirror ratio of the current mirrors. Thereby, the first factor M for the current mirror NB1, NB1$b$ and the current mirror NB2, NB2$b$ are usually equal, as well as the second factor N for the current mirrors PB1, PB1b and the current mirrors PB2, PB2b.

In the exemplary embodiment shown in FIG. 1 using field-effect transistors, the first and the second factor M, N or the current mirror ratios correspond, for example, to the respective channel widths/lengths ratios of the field-effect transistors. In one exemplary embodiment, the first and the second factor M, N are different.

With the provided first and second signal paths SP1, SP2 with a first pair of transistors NB1, NB2 and a second pair of transistors PB1, PB2, a current in the first and the second signal path SP1, SP2 is controlled by controlling the first pair of transistors NB1, NB2 with a differential input signal. The controlled current is scaled down for the first and the second signal path SP1, SP2 respectively in the first and the second auxiliary current path AP1, AP2 by the first factor M. The second pair of transistors PB1, PB2 is controlled for each one of the signal paths SP1, SP2 in such a manner that the scaled down current in the auxiliary current path AP1, AP2 of the respective other signal path SP2, SP1 is scaled up by the second factor N. A difference between the first and the second factor M, N is balanced by providing a balancing current to the first and the second signal path. In this embodiment, this is done by means of the first and the second current source I1, I2.

Controlling of the second pair of transistors PB1, PB2 by means of the current mirror transistors PB1b, PB2b results in a further controlling of the current and the signal paths SP1, SP2. A differential output signal is provided at the output taps OUTM, OUTP depending on the controlled current. Controlling of the upper current mirrors PB1, PB1b and PB2, PB2b using the auxiliary current paths AB1, AB2 can be seen as a cross-coupling of the first and the second signal path SP1, SP2. The circuit can be called a cross-coupled mirror circuit, for example.

If the differential input signal shows no amplitude, that means if a voltage at the inputs INP, INM is equal, the amplifier stage is in an equilibrium or balanced state, which corresponds to a quiescent current mode. A respective quiescent current $I_{out}$ can be calculated for this embodiment with the following equations. The current in the signal paths SP1, SP2 of the amplifier stage, which is controlled by the PMOS transistors, is:

$$I_{out} = N \cdot I_{par} + I_0, \quad (1)$$

whereby $I_{par}$ corresponds to the current in an auxiliary current path and $I_0$ corresponds to the current of the current sources I1, I2. The current in the signal paths SP1, SP2 which is controlled by the NMOS transistors is:

$$I_{out} = M \cdot I_{par}. \quad (2)$$

From equations (1) and (2), the quiescent current IOUT can be calculated as a function of $I_0$ and is:

$$I_{out} = I_0 \cdot \frac{M}{M-N}. \quad (3)$$

The current mirror ratios or the first and the second factor M, N respectively can be chosen relatively large. This results in a control current $I_{par}$ in the auxiliary current paths AP1, AP2 which is relatively small. For example, M=5 and N=4. The factors M, N should be different, whereby for this embodiment, the first factor M should be larger than the second factor N.

The amplifier stage according to the invention, which is operated in a class AB mode of operation, differs from known conventional output stages without negative feedback by only comprising an auxiliary current path AP1, AP2, respectively, with which a control voltage of the output transistors PB1, PB2 can be set. As a scaled down control current is used additionally, an additional current consumption in the auxiliary current paths AP1, AP2 usually is negligibly small which leads to a high efficiency of the amplifier stage according to this exemplary embodiment of the invention.

As controlling of the PMOS transistors PB1, PB2 is done by current mirrors, the gate connectors or control inputs of the PMOS transistors PB1, PB2 show a low resistive load and therefore offer a high frequency bandwidth. When using field-effect transistors, the transistor width of the output transistors can be chosen relatively small because a gate source voltage of the output transistors is independent of a control voltage. This again results in reduced parasitic gate capacitances and advantageously in a high frequency bandwidth.

Adjusting of the quiescent current in the first and the second signal path SP1, SP2 is done by choosing the current mirror ratios or the first and the second factor M, N respectively and by choosing the value $I_0$ of the first and the second current source I1, I2. The first and second factor M, N are usually different. Contrary to conventional class AB output stages with negative feedback, an additional control loop for setting the quiescent current in the amplifier stage can be omitted in the amplifier stage according to the invention. Saving of the control loop again results in a reduced current consumption of the arrangement as well as in an improved frequency bandwidth, which is usually reduced by such a control loop. A maximum current in the signal paths SP1, SP2 of the amplifier stage mainly depends on a control voltage at the input INP, INM of the amplifier stage.

According to the exemplary embodiment of FIG. 1, the current can reach high values. An amplifier stage according to the invention therefore comprises a high driving ability and a high amplitude range.

With the example of FIG. 1, it can also be achieved advantageously that the amplifier stage according to the invention can be operated with a low supply voltage, that means a low voltage difference between the supply voltage tap and the reference voltage tap. A minimum supply voltage $V_{SUP}$ can be determined by:

$$V_{SUP} \geq V_{dsat}(NB1b) + V_{th}(PB1b) + V_{dsat}(PB1b) \quad (4)$$

whereby $V_{dsat}(NB1b)$ is a saturation voltage of the lower current mirror transistors NB1b or NB2b, respectively. $V_{dsat}(PB1b)$ is the saturation voltage of the upper current mirror transistors PB1b, PB2b and $V_{th}(PB1b)$ is a threshold voltage of the upper current mirror transistors PB1b, PB2b. With common values for saturation voltages of about 0.2 V and threshold voltages of about 0.4 V, a lower limit for a supply voltage $V_{sup}$ according to equation (4) results in a value of about 0.8 V. Conventional class AB amplifier stages are usually dependent on a threshold voltage by a factor of 2 and therefore need a significantly higher supply voltage. According to the embodiment of FIG. 1, the transistors shown in the embodiment can be replaced by transistors of a complimentary conduction type, respectively. For example, all transistors of a first conduction type, e.g. n-channel, can be replaced by a transistor of a second conduction type, e.g. p-channel. In the same way, in this case all transistors of the second conduction type should be replaced by transistors of the first conduction type. Thereby, a polarity of a supply voltage at the supply voltage tap and the reference voltage tap VDD, GND has to be considered.

According to an alternative embodiment of the invention, instead of field-effect transistors also bipolar transistors, BIC-MOS transistors, or other transistor types can be used.

In another exemplary embodiment of the invention, an amplifier stage comprises a first and a second signal path SP1, SP2, each comprising a first transistor NB1, NB2 of a first conduction type and a second transistor PB1, PB2 of a second conduction type. The respective first transistors NB1, NB2 comprise a control input INP, INM for providing an input signal of the amplifier stage. A first and a second signal output OUTP, OUTM are formed by a respective connection node of the first and the second transistors NB1, NB2, PB1, PB2, respectively.

Additionally, there are provided means for scaling down, which scale down a current flowing through the respective first transistors NB1, NB2 in a first and a second auxiliary current path AP1, AP2 by a first factor M. Furthermore, means for scaling up are provided which control the second transistor of each one of the signal paths in such a manner that the scaled down current in the first and the second auxiliary current path AP1, AP2 of the respective other of the signal paths is scaled up by a second factor N. The first and the second factor M, N are different. The amplifier stage further comprises means for balancing the different factors M, N which provide a balancing current to the first and the second signal paths SP1, SP2 or to the first and the second auxiliary current paths AP1, AP2.

The means for scaling down and the means for scaling up each can comprise a current mirror, however, other circuits configured or otherwise adapted to provide such circuit functionality may be employed, and such alternatives are contemplated as falling within the scope of the present invention.

Figure 2:
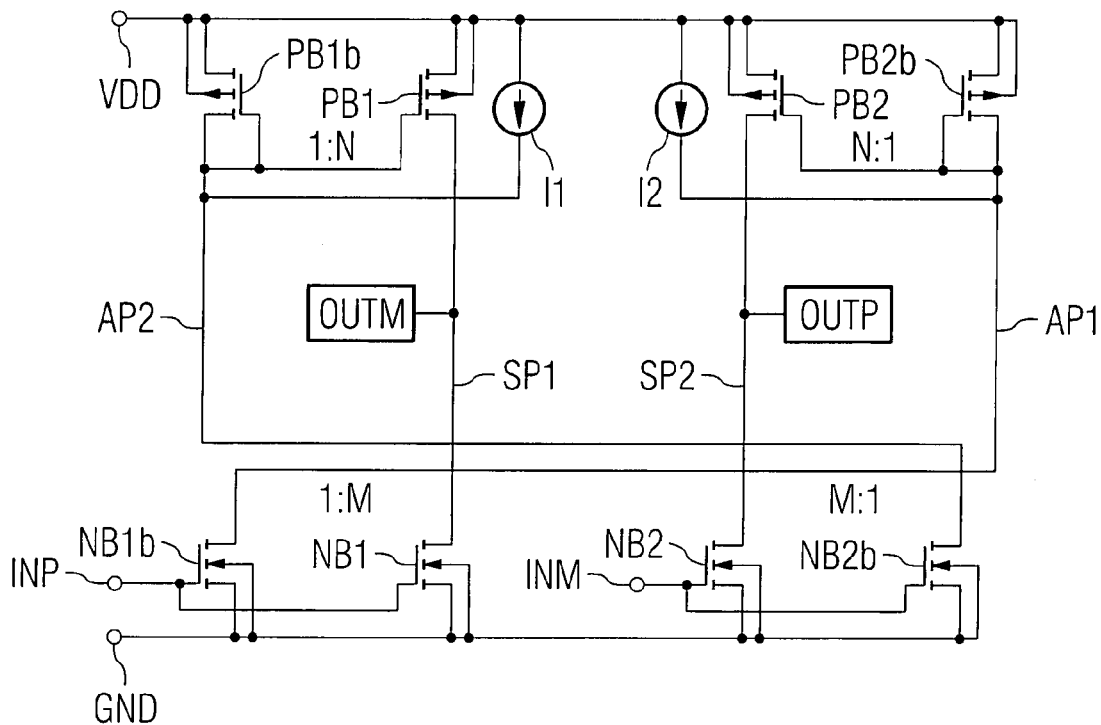
FIG. 2 is a schematic diagram illustrating a second exemplary embodiment of an amplifier stage according to the invention.

FIG. 2 shows another exemplary embodiment of an amplifier stage according to the invention. As a difference to the embodiment shown in FIG. 1, the first and the second current source I1, I2 are connected in parallel to the upper current mirror transistors PB1b, PB2b in this embodiment. Therefore, a current is fed into the first and the second auxiliary current paths AP1, AP2 by the current sources I1, I2.

In this embodiment, again a first and a second signal path SP1, SP2 are provided which comprise a series connection of a first transistor NB1, NB2 of a first conduction type and a second transistor PB1, PB2 of a second conduction type. The respective first transistors NB1, NB2 of the first and the second signal path SP1, SP2 are provided with an input signal. Simultaneously, a respective fourth transistor NB1b, NB2b of the first conduction type, which is connected as a current mirror to the respective first transistor NB1, NB2, is provided with the input signal. Controlling of the respective second transistor PB1, PB2 of the first and the second signal path SP1, SP2 is done by a respective third transistor PB1b, PB2b of the second conduction type, which is connected as a current mirror to the respective second transistor PB1, PB2. Controlling of the respective second transistors PB1, PB2 is done depending on a current through the respective fourth transistor NB2b, NB1b. Setting of a quiescent current is effected by a current source I1, I2 which is connected in parallel to the respective third transistor PB1b, PB2b. An amplified signal is provided at a respective connection node of the first and the second transistor NB1, NB2, PB1, PB2, respectively.

As an alternative, the quiescent current can be set by a current source which is connected in parallel to one of the first, second, third, or fourth transistors NB1, NB2, PB1, PB2, NB1b, NB2b, PB1b, PB2b.

Similar to equation (3), a quiescent current IOUT in the embodiment according to FIG. 2 is provided by:

$$I_{out} = I_0 \cdot \frac{M \cdot N}{N - M}. \quad (5)$$

Thereby, the second factor M should be smaller than the first factor N. For example, for the first factor M, a value of 4 and for the second factor N, a value of 5 can be chosen. The shown amplifier stage again can be titled as a class AB amplifier stage with cross-coupled signal paths SP1, SP2. Controlling over cross of the respective current mirrors again is carried out by means of the currents in the auxiliary current paths AP1, AP2. The currents can be held advantageously small because of the scaling down and the scaling up. Therefore, the shown amplifier stage can be distinguished from conventional amplifier stages by a low current consumption and high frequency bandwidth simultaneously.

Also in this embodiment the transistors can be replaced by respective transistors of a complimentary conduction type. It is also possible to replace the field-effect transistors by respective bipolar transistors or other transistor types. For example, instead of the NMOS transistors NPN transistors and instead of the PMOS transistors PNP transistors can be used.

Figure 3:
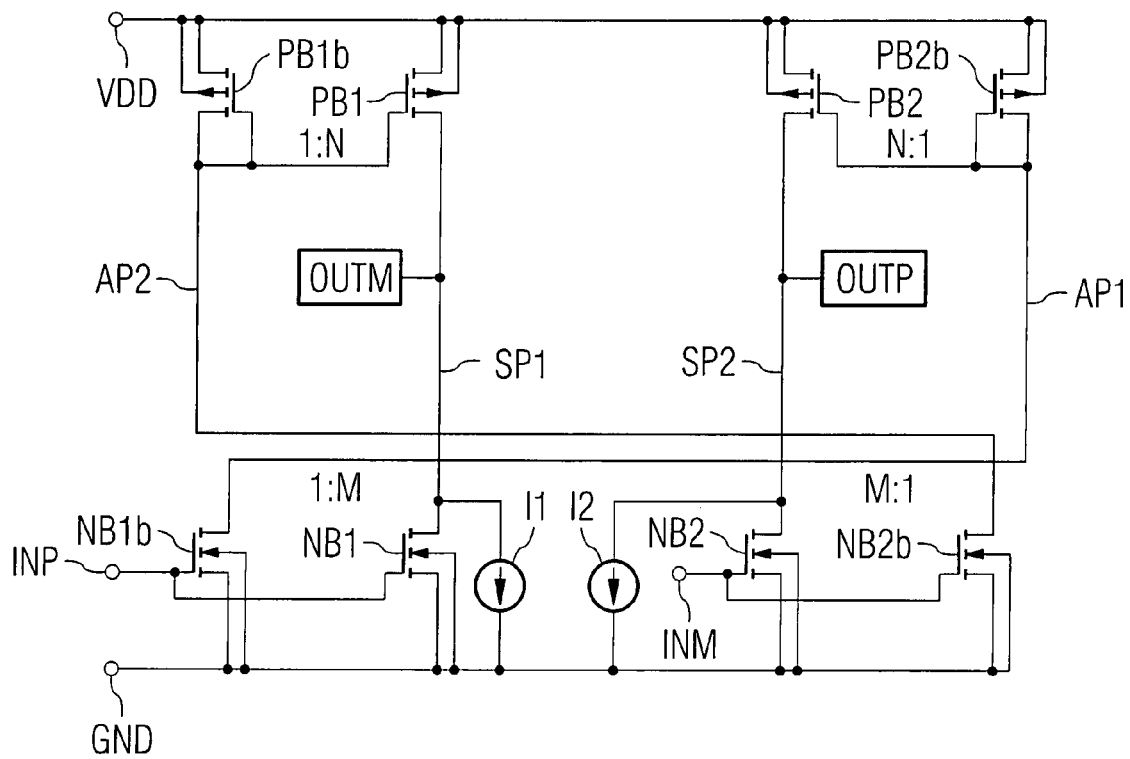
FIG. 3 is a schematic diagram illustrating a third exemplary embodiment of an amplifier stage according to the invention.

FIG. 3 shows a further exemplary embodiment of an amplifier stage according to the invention. In this embodiment, the first and the second current source I1, I2 are connected in parallel to the respective first transistors NB1, NB2 of the first and the second signal path SP1, SP2. In this way, a current in the first and the second signal paths SP1, SP2 are influenced directly again.

Thereby, a differential input signal is amplified to a differential current. The differential current is scaled down by a first factor M. The first factor M, for example, results from a current mirror ratio between the transistors NB1, NB1b or NB2, NB2b, respectively.

The differential current is controlled over cross by scaling up the scaled down differential current by a second factor N which is different from the first factor M. A balancing current is provided for influencing the differential current. Depending on the differential current, a differential output signal is delivered.

The balancing current can be provided also for influencing of the scaled down differential current in an alternative embodiment.

A quiescent current $I_{OUT}$ of the amplifier stage can again be set by choosing the values of the first factor M and the second factor N, which in this example corresponds to a current mirror ratio of the transistors PB1, PB1b and PB2, PB2b. With $I_0$ being the current through the first and the second current source I1, I2, similar to equation (3) or (5), the quiescent current $I_{OUT}$ is:

$$I_{out} = I_0 \cdot \frac{N}{N - M}. \quad (6)$$

In this case, the second factor N should be larger than the first factor M. Hence, also with this embodiment, an amplifier stage with a high frequency bandwidth and low current consumption can be realized.

Figure 4:
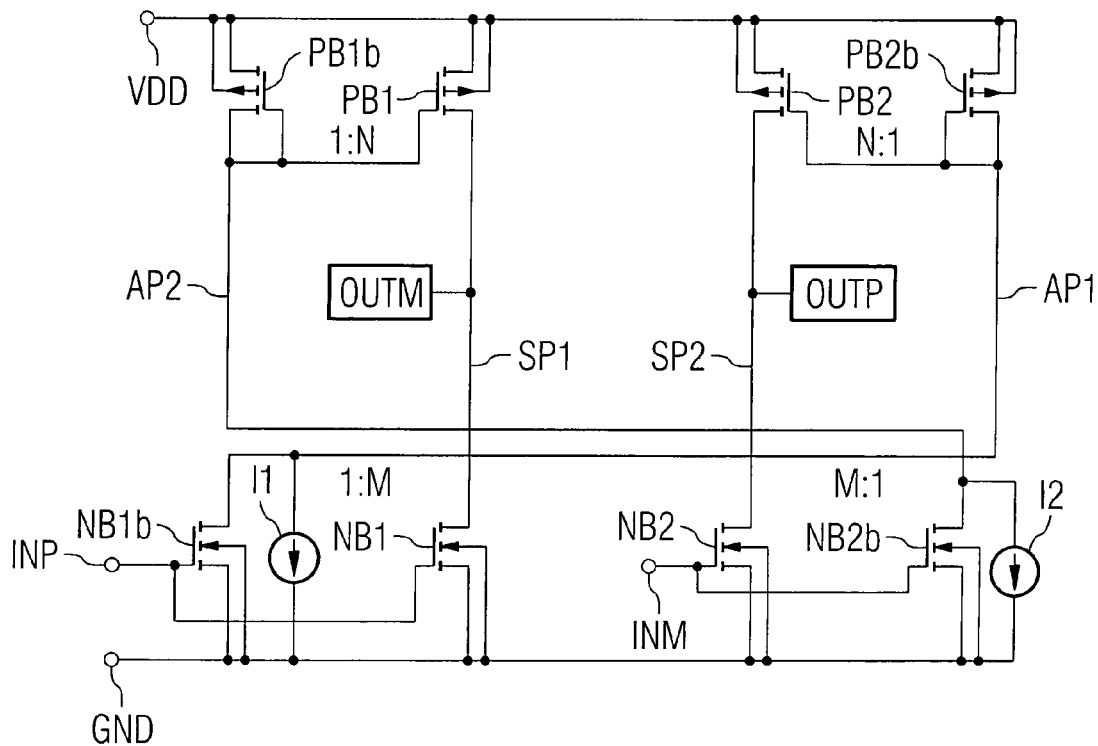
FIG. 4 is a schematic diagram illustrating a fourth exemplary embodiment of an amplifier stage according to the invention.

FIG. 4 shows another exemplary embodiment of an amplifier stage according to the invention. The first and the second current source I1, I2 are connected in parallel to the current mirror transistors NB1*b*, NB2*b*, respectively, and are able to influence the control current in the auxiliary current paths AP1, AP2. The quiescent current $I_{OUT}$ which can be set for this embodiment results to $$I_{out} = I_0 \cdot \frac{M \cdot N}{M - N}. \quad (7)$$

In this case, the first factor M should be chosen larger than the second factor N.

To be able to achieve high frequency bandwidths, in one example the parasitic capacitances at the gate nodes of the output transistors should be held as small as possible. This can for example be achieved by using transistors with short or minimal channel lengths. The respective current mirrors NB1, NB1*b*, NB2, NB2*b*, PB1, PB1*b*, PB2, PB2*b* could comprise a misadjustment in this case because of short channel effects. This is because the respective transistors belonging to each one of the current mirrors potentially do not see the same drain/source voltage. This can lead to an effective change of the current mirror ratio or the first and the second factor M, N, respectively.

Thereby, also the quiescent currents according equations (3), (5), (6), and (7) can be changed unfavorably, so a wanted low quiescent current cannot be complied with.

Figure 5:
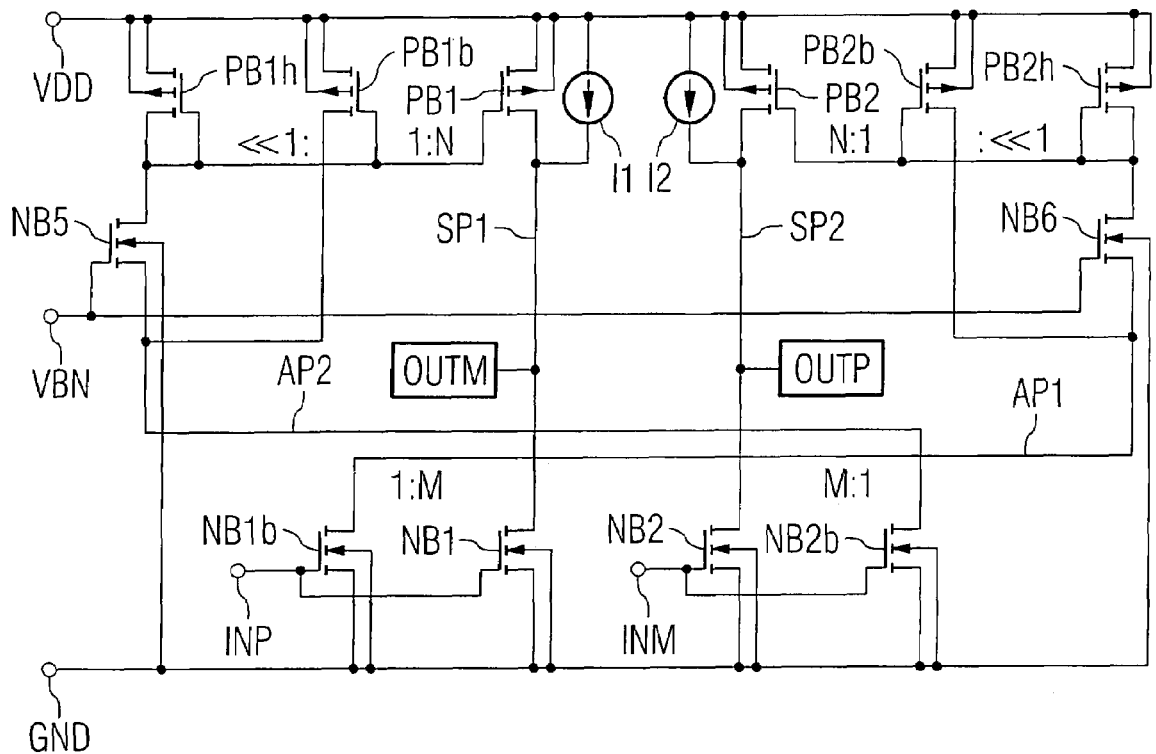
FIG. 5 is a schematic diagram illustrating a fifth exemplary embodiment of an amplifier stage according to the invention.
Figure 9:
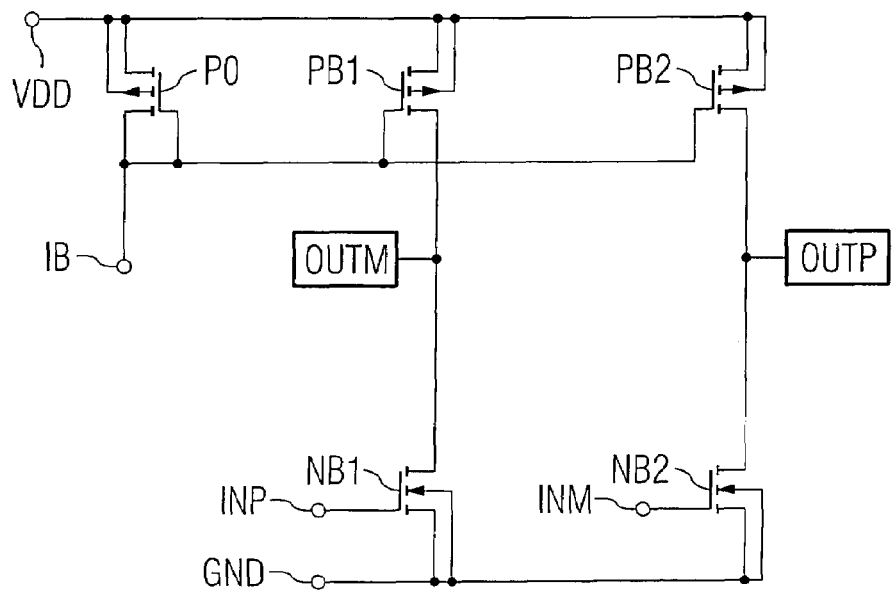
FIG. 9 is a schematic diagram illustrating a conventional amplifier stage.

FIG. 5 shows another exemplary embodiment of an amplifier stage according to the invention directed to, for example, transistors with short channel effects. It is, however, possible to use the shown arrangement also for transistors with larger channel length or other types of transistors, and such alternatives are contemplated as falling within the scope of the invention.

In addition to the embodiment shown in FIG. 1, the amplifier stage of FIG. 5 comprises a respective fifth transistor PB1*h*, PB2*h* and a respective sixth transistor NB5, NB6 which form a current path as a series connection, respectively, and are connected in parallel to the control path of the respective third transistor PB1*b*, PB2*b*. The respective fifth transistors PB1*h*, PB2*h* are of the second conduction type, as well as the respective second and third transistors PB1, PB1*b*, PB2, PB2*b* which is in this case p-channel. The respective sixth transistors NB5, NB6 are formed as transistors of the first conduction type as are the first transistors NB1, NB2, which is n-channel in this case.

The respective fifth transistor PB1*h*, PB2*h* for the first and the second signal path SP1, SP2 is connected to the respective second and third transistor PB1, PB2, PB1*b*, PB2*b* as a current mirror. Thereby, for each of the first and the second signal path SP1, SP2, the transistors PB1*b*, PB2*b*, PB1*h*, PB2*h* are usually dimensioned in such a manner that a current through the respective fifth transistor PB1*h*, PB2*h* is smaller than a current through the respective third transistor PB1*b*, PB2*b* by at least one order of magnitude. For example, the respective currents differ by a factor of about 20.

A controlling of control inputs of the transistors PB1, PB1*b*, PB1*h* and PB2, PB2*b*, PB2*h*, respectively, is effected by control currents over the sixth transistor NB5, NB6, respectively. The respective sixth transistors NB5, NB6 is connected between the fourth transistors NB1*b*, NB2*b* of one signal path, respectively, of the assemblage of the first and the second signal path SP1, SP2 and the second, third and fifth transistor PB1, PB1*b*, PB1*h*, PB2, PB2*b*, PB2*h* of the respective other signal path from the assemblage of the first and the second signal path SP1, SP2.

A control voltage can be provided to the control input VBN of the respective sixth transistor NB5, NB6. Thereby, the control voltage should be chosen in such a manner that the source connector of the respective sixth transistor NB5, NB6 which is coupled to the drain connector of the respective third transistor PB1*b*, PB2*b* shows a voltage level which approximately corresponds to a common mode voltage level which is effective in a quiescent current mode at the signal outputs OUTM, OUTP. By this, it can be achieved that voltage proportions at the transistors PB1*b*, PB2*b* between drain and source connectors are similar as the ones for the corresponding output transistors PB1, PB2. Therefore, wanted current mirror ratios with a second factor N can be complied with advantageously.

Accordingly, scaling up is effected by the third transistor PB1*b*, PB2*b*, respectively, whereby a control voltage of the respective third transistor PB1*b*, PB2*b* is set depending on the scaled down current and the control voltage at the control input VBN.

By inserting the respective sixth transistors NB5, NB6, it therefore can be achieved that the drain voltage and the gate voltage of the respective third transistors PB1*b*, PB2*b* are decoupled from each other. Setting of the control voltage of the third transistors PB1*b*, PB2*b*, respectively, is inter alia effected by the respective fifth transistors PB1*h*, PB2*h*. If the channel width of the fifth transistor PB1*h*, PB2*h*, respectively, is chosen significantly smaller than the channel width of the third transistors PB1*b*, PB2*b*, the control current in the auxiliary current paths AP1, AP2 is split in such a manner that a bigger part of the control current flows through the respective third transistor PB1*b*, PB2*b* and a smaller part flows through the respective fifth transistor PB1*h*, PB2*h*. For example, the control current is split in such a manner that 99% of the control current flows through the respective third transistor PB1*b*, PB2*b* and 1% flows through the respective fifth transistor PB1*h*, PB2*h*. Accordingly, the control voltage for the respective second transistors PB1, PB2 is further on determined by the channel width of the third transistors PB1*b*, PB2*b*.

Therefore, a control voltage of the respective third transistor PB1*b*, PB2*b* is adjusted by means of the fifth transistor PB1*h*, PB2*h* which is connected to the respective third transistor PB1*b*, PB2*b* as a current mirror, depending on a current through the respective fourth transistor NB2*b*, NB1*b*.

Thereby, a respective current mirror ratio of the respective second and third transistors PB1, PB2, PB1*b*, PB2*b* can be adjusted depending on the control voltage which is provided to the sixth transistor NB5, NB6, respectively.

In an alternative embodiment, means for stabilizing the second factor are provided which are connected in parallel to the means for scaling up and which control the means for scaling up depending on the scaled down current and a control voltage. In the shown embodiment, it is possible to use transistors with a small channel length. Therefore, parasitic capacitances of the circuit can be reduced. This results in a higher frequency bandwidth achievable. Additionally, the current mirror ratios can be held stable, so low quiescent currents can be set in quiescent current modes. The shown amplifier stage according to the invention therefore can be operated with a low current consumption. An additional effort for the circuit for stabilizing the current mirror ratio can be neglected as being small.

Figure 6:
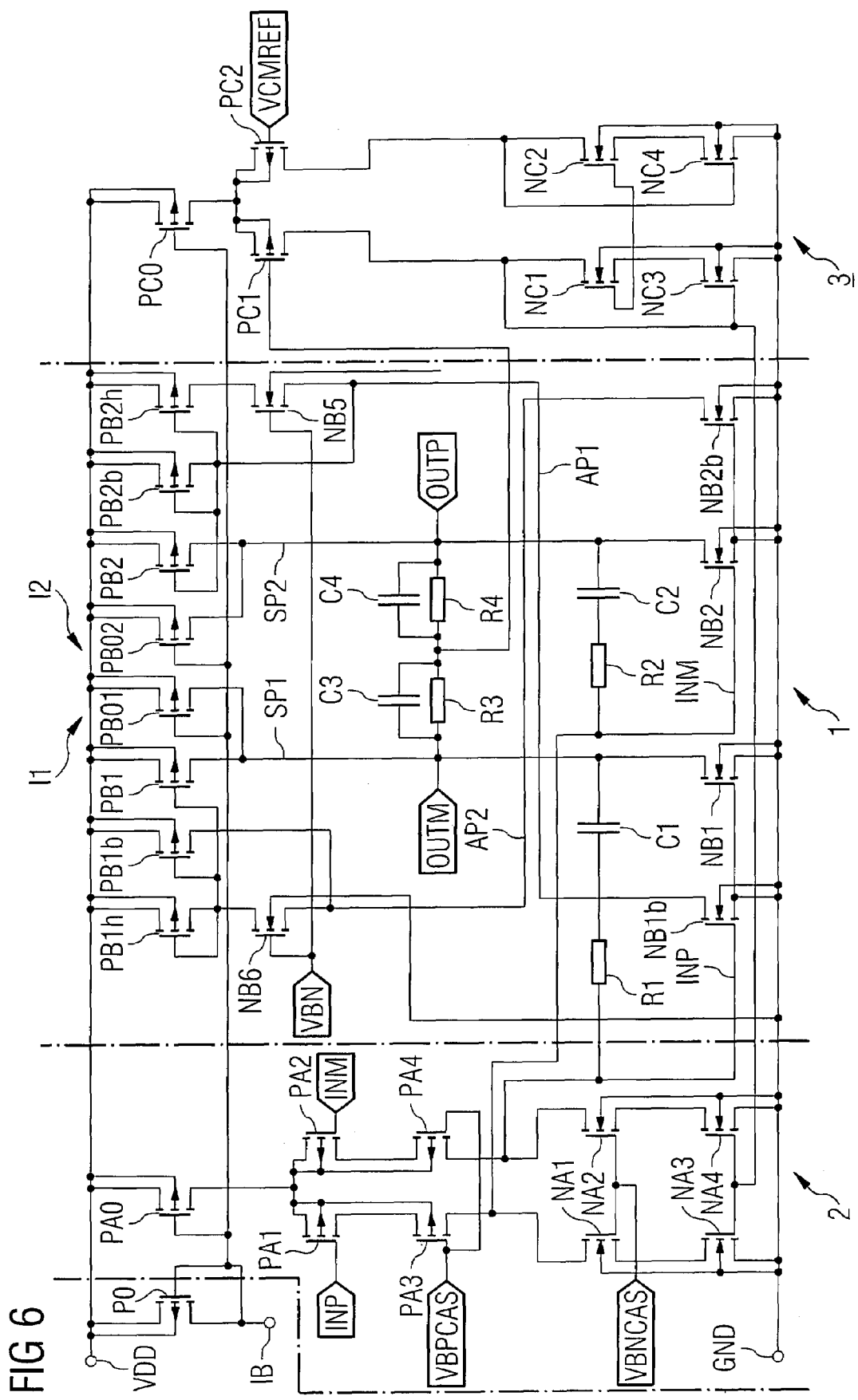
FIG. 6 is a schematic diagram illustrating an exemplary embodiment of an operational amplifier according to the invention.

FIG. 6 shows an exemplary embodiment of an operational amplifier according to the invention. The operational amplifier comprises a differential amplifier 2 as an input stage of the operational amplifier, an amplifier stage 1 as an output stage of the operational amplifier and a common mode control circuit 3 for adjusting a common mode voltage of the amplifier stage 1.

The amplifier stage 1 basically corresponds in one example to the embodiment of an amplifier stage according to the invention shown in FIG. 5. As an alternative, also one of the embodiments shown in the FIGS. 1 to 4 could be used as the output stage.

The current sources I1, I2 are formed as PMOS transistors PB01, PB02 in this example. Their control inputs are coupled to a reference current source P0 which also is formed as a PMOS transistor. The current sources I1, I2 form a current mirror, respectively, with the reference current source P0 which is fed with a reference current over the reference current input IB.

The differential amplifier 2 comprises a current source implemented as PMOS transistor PA0 which is also coupled to the reference current source P0. Two signal paths comprise a pair of transistors PA1, PA2, their control inputs IMP1 and IM1 forming a differential input of the operational amplifier. Additionally, cascode transistors PA3, PA4 are provided which are connected in series to the transistors PA1, PA2, respectively. The gate connectors of the cascode transistors PA3, PA4 are coupled to an input VBPCAS for providing a first cascode voltage.

Furthermore, each of the two signal paths comprises a series connection of an NMOS transistor NA1, NA3 and NA2, NA4, respectively. The transistors NA1, NA2 are formed as cascode transistors again, their control connection coupled to a further input VBNCAS for providing a second cascode voltage. The control connections of the transistors NA3, NA4 are connected to the common mode control circuit 3 for controlling the common mode voltage.

The differential output of the input stage 2 which is formed by the connection nodes of the transistors NA1, PA3 and NA2, PA4, respectively, is coupled to the input INP, INM of the output stage 1. Furthermore, the first and the second signal paths SP1, SP2 of the output stage 1 are coupled with the output of the input stage 2 over resistors R1, R2 and capacitors C1, C2.

The common mode control circuit 3 comprises a current source PC0 implemented using a PMOS transistor and transistors PC1, PC2, NC1, NC2, NC3, NC4 which are connected in a pair of differential current paths. A control input of the transistor PC2 is coupled to a reference input VCMREF for providing a reference voltage for the common mode control. The control connection of the corresponding transistor PC1 is coupled to the signal output OUTM, OUTP of the output stage 1 by means of a coupled circuit which comprises resistors R3, R4 and capacitors C3, C4.

In the input stage 2, a differential input signal provided at the inputs INP1, INM1 is preamplified by the differential amplifier. Instead of the differential amplifier with the cascode arrangement, also any other differential amplifier circuit could be used. The preamplified input signal is amplified in the output stage 1 according to the inventive principle described before. When amplifying the input signal and continued amplifying of the signals in the output stage 1, a phase shift between input signal and output signal can occur.

To be able to ensure stability of the operational amplifier, it is usually necessary to limit this phase shift to an angle which is smaller than 180°. For this reason, in the shown embodiment, capacitors C1, C2 are provided which achieve a compensation of the phase shift between input and output signal and therefore improve the phase reserve of the operational amplifier.

Capacitors C1, C2 connected in a way shown here also can be called Miller capacitors. The operational amplifier according to the invention is comparable to a conventional Miller operational amplifier regarding this matter. The resistors R1, R2 effect a further improvement of the phase reserve but could also be omitted without changing the basic principle of the circuit arrangement.

Setting the quiescent current in the output stage 1 of the operational amplifier is effected, as described before, by choosing the first and the second factor M, N and by choosing the value of the current which is provided by the constant current sources I1, I2. The common mode control of the differential operational amplifier serves as well for adjusting the common mode voltage as for setting the quiescent current in the output stage 1. As the current sources I1, I2 are not part of the control loop, which is inter alia formed by the cross-coupling and the common mode control, the quiescent current in the output stage 1 is independent of a control voltage of the transistors.

As mentioned before, by providing the control voltage at the control input of the transistors NB5 and NB6 respectively the drain voltage of the respective transistors PB1b and PB2b is controlled in such a manner that it corresponds to the common mode voltage which is provided by the common mode control circuit 3 and which is effective at the output OUTM, OUTP in the quiescent current mode.

Figure 7:
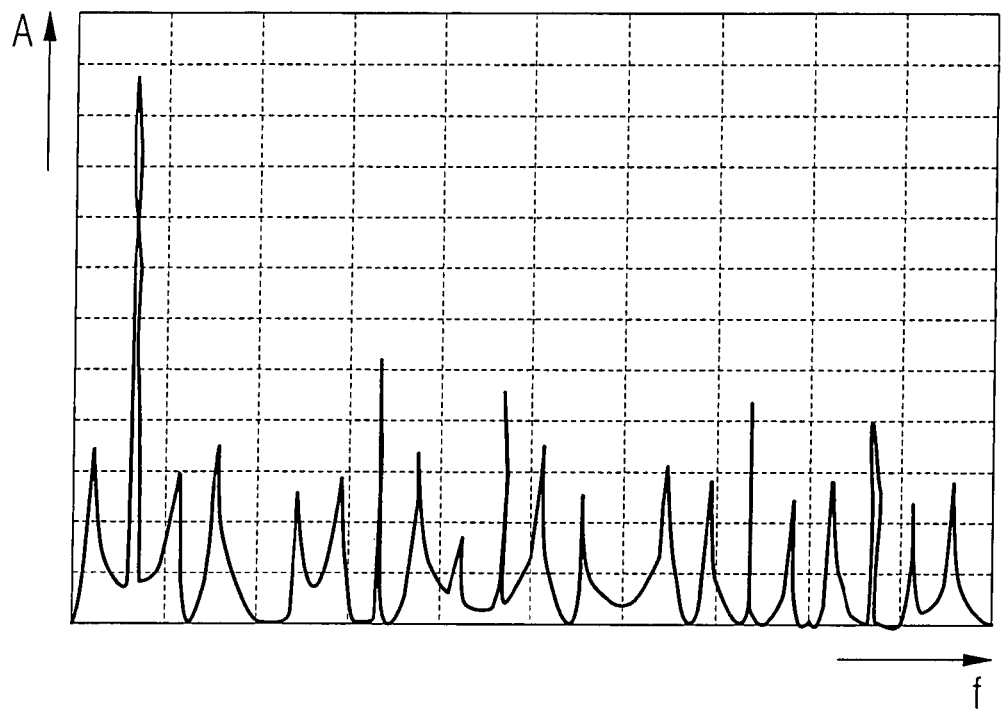
FIG. 7 is an exemplary graph illustrating harmonics of a conventional operational amplifier.
Figure 8:
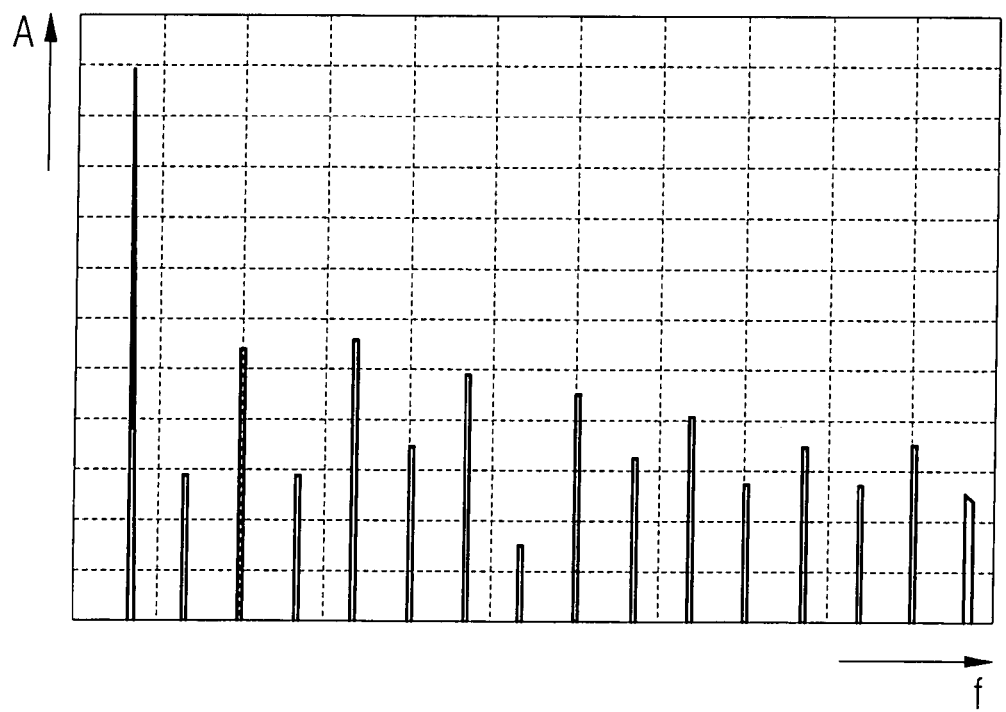
FIG. 8 is an exemplary graph illustrating harmonics of an operational amplifier according to the invention.

In FIGS. 7 and 8, the linearity behavior of a two-stage operational amplifier with a conventional output stage and an output stage according to the invention are compared in the frequency domain. Therefore, amplitudes A are shown depending on a frequency f, respectively. FIG. 7 shows a diagram of harmonics of the operational amplifier with a conventional output stage. In FIG. 8, an exemplary diagram of harmonics of an operational amplifier with an output stage according to the invention is shown. In both cases, the operational amplifiers are connected in an inverted fashion, that means as well in the input path as in the feedback path resistors are provided. In this example, the output of the operational amplifier is connected to a load which includes a parallel connection of a resistive and a capacitive load. The respective input stage and common mode control circuits of the two operational amplifiers are formed of similar type. For comparing the linearity behavior, both circuit arrangements are provided with a 20 MHz sinusoidal input signal.

From FIGS. 7 and 8 one can recognize that the non-linear behavior of the conventional operational amplifier and of the operational amplifier with the output stage according to the invention is comparable despite the cross-coupled current paths. For a more detailed comparison, the results are summarized tabularily.

|  | conventional class A output stage | output stage according to the invention |
|---|---|---|
| basic wave (20 MHz) | −10.7 dB | −10.7 dB |
| 3rd harmonic (60 MHz) | −63.8 dB | −65.8 dB |
| 5th harmonic (100 MHz) | −65.1 dB | −64.2 dB |

-continued

| | conventional class A output stage | output stage according to the invention |
|---|---|---|
| 7th harmonic (140 MHz) | −71.4 dB | −69.1 dB |
| signal/ total distortion | −50.28 dB | −50.45 dB |

One can see that despite the class AB mode of operation of the operational amplifier according to the invention, the rising harmonics are similar, whereby the signal distortion ratio is slightly improved. However, the quiescent current of the amplifier stage according to the invention including the currents in the auxiliary current paths can be reduced by 70% compared to the quiescent current of the conventional class A output stage.

Although the invention has been illustrated and described with respect to one or more implementations, alterations and/or modifications may be made to the illustrated examples without departing from the spirit and scope of the appended claims. In particular regard to the various functions performed by the above described components or structures (blocks, units, assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

The invention claimed is:

1. An amplifier stage, comprising:
a first and a second signal path, each comprising a series connection of a first transistor of a first conduction type which comprises a control input configured to receive an input signal to the amplifier stage and a second transistor of a second conduction type, the first and the second signal paths each being connected between a supply voltage tap and a reference voltage tap;
a first and a second signal output formed at a respective connection node of the respective first and second transistors in the first and second paths, respectively;
a third transistor of the second conduction type connected to the respective second transistor as a current mirror in each of the first and second paths;
a fourth transistor of the first conduction type connected to the respective first transistor as a current mirror and configured to control the third transistor of the other signal path respectively in each of the first and second paths; and
a current source connected in parallel to one of the respective first, second, third and fourth transistors in each of the first and second paths,
wherein for each of the first and second signal paths the transistors are dimensioned such that a current through the respective first transistor is larger than a current through the respective fourth transistor by a first factor.

2. The amplifier stage of claim 1, wherein for each of the first and the second signal paths the transistors are dimensioned such that a current through the respective second transistor is larger than a current through the respective third transistor by a second factor, wherein the first and the second factors are different.

3. The amplifier stage of claim 2, wherein the transistors comprise field effect transistors and are dimensioned such that the first and the second factor result from a respective channel-width-length ratio of the transistors.

4. The amplifier stage of claim 1, wherein the current sources comprise constant current sources, respectively.

5. An amplifier stage, comprising:
a first and a second signal path, each comprising a series connection of a first transistor of a first conduction type which comprises a control input configured to receive an input signal to the amplifier stage and a second transistor of a second conduction type, the first and the second signal paths each being connected between a supply voltage tap and a reference voltage tap;
a first and a second signal output formed at a respective connection node of the respective first and second transistors in the first and second paths, respectively;
a third transistor of the second conduction type connected to the respective second transistor as a current mirror in each of the first and second paths;
a fourth transistor of the first conduction type connected to the respective first transistor as a current mirror and configured to control the third transistor of the other signal path respectively in each of the first and second paths;
a current source connected in parallel to one of the respective first, second, third and fourth transistors in each of the first and second paths
a fifth transistor of the second conduction type connected to the second and the third transistor as a current mirror respectively, in each of the first and second signal paths; and
a sixth transistor of the first conduction type in each of the first and second signal paths connected between the first transistor of one of the signal paths and the second, third and fifth transistor of the other of the signal paths respectively;
wherein a current path of the respective fifth and sixth transistors are connected in parallel to the controlled path of the respective third transistor.

6. The amplifier stage of claim 5, wherein for each of the first and the second signal paths the transistors are dimensioned such that the current through the respective fifth transistor is smaller than a current through the respective third transistor by at least one order of magnitude.

7. An amplifier stage, comprising:
a first and second signal path with a respective first transistor of a first conduction type which comprises a control input configured to receive an input signal of the amplifier stage and a respective second transistor of a second conduction type;
a first and a second signal output formed at a respective connection node of the first and the second transistors, respectively;

means for scaling down a current which flows through the respective first transistor by a first factor, the scaled down current flowing in a first and a second auxiliary current path;

means for scaling up the scaled down current, the scaling up means operable to control the second transistor of one of the signal paths respectively in such a manner that the scaled down current in the first and the second auxiliary current paths associated with the respective other of the signal paths is scaled up by a second factor which is different from the first factor; and means for balancing the different factors to provide a balancing current to the first and the second signal paths or to the first and the second auxiliary current paths.

8. The amplifier stage of claim 7, wherein the means for scaling down and the means for scaling up each comprise a current mirror.

9. The amplifier stage of claim 7, further comprising means for stabilizing the second factor connected in parallel to the means for scaling up, the stabilizing means operable to control the means for scaling up depending on the scaled down current and a control voltage.

10. A method for amplifying a signal, comprising:
providing a first and a second signal path each with a respective first transistor of a first conduction type which comprises a control input configured to receive an input signal, and a second transistor of a second conduction type;
controlling a current in the first and the second signal paths by controlling the first transistors with a differential input signal;
scaling down of controlled current in a first and a second auxiliary current path by a first factor;
controlling the second transistor for one of the signal paths respectively in such a manner that the scaled down current in the auxiliary current path of the respective other one of the signal paths is scaled up by a second factor which is different from the first factor;
balancing the different factors by providing a balancing current to the first and the second signal paths or to the first and the second auxiliary current paths; and
delivering a differential output signal depending on the controlled current.

11. The method of claim 10, wherein the scaling up or the scaling down, or both, is done by current mirroring.

12. The method of claim 10, wherein the scaling up comprises providing a respective further transistor and a control voltage of the respective further transistor and adjusting the scaling depending on the scaled down current and the control voltage.

13. A method for amplifying a signal, comprising:
providing a first and a second signal path each comprising a series connection of a first transistor of a first conduction type and a second transistor of a second conduction type, the first and the second signal path connected between a supply voltage tap and a reference voltage tap;
controlling the first transistor of the first and the second signal path respectively with an input signal;
controlling a respective fourth transistor of the first conduction type with the input signal, the respective fourth transistor being connected to the respective first transistor as a current mirror;
controlling the respective second transistors of the first and the second signal paths with a respective third transistor of the second conduction type which is connected to the respective second transistor as a current mirror, the controlling depending on a current through the fourth transistor;
adjusting a quiescent current with a current source which is connected in parallel to one of the first, second, third and fourth transistors of the first and the second signal paths respectively; and
providing an amplified signal at a respective connection node of the first and the second transistors respectively,
wherein for each of the first and the second signal paths a current through the respective first transistor is larger than a current through the respective fourth transistor by a first factor.

14. The method of claim 13, wherein for each of the first and the second signal paths a current through the respective second transistor is larger than a current through the respective third transistor by a second factor.

15. The method of claim 14, wherein the first and the second factor are different.

16. A method for amplifying a signal, comprising:
providing a first and a second signal path each comprising a series connection of a first transistor of a first conduction type and a second transistor of a second conduction type, the first and the second signal path connected between a supply voltage type and a reference voltage tap;
controlling the first transistor of the first and the second signal path respectively with an input signal;
controlling a respective fourth transistor of the first conduction type with the input signal, the respective fourth transistor being connected to the respective first transistor as a current mirror;
controlling the respective second transistors of the first and the second signal paths with a respective third transistor of the second conduction type which is connected to the respective second transistor as a current mirror, the controlling depending on a current through the fourth transistor;
adjusting a quiescent current with a current source which is connected in parallel to one of the first, second, third and fourth transistors of the first and the second signal paths respectively;
providing an amplified signal at a respective connection node of the first and the second transistors respectively; and
controlling a control voltage of the respective third transistors with a fifth transistor of the second conduction type which is connected to the respective third transistor as a current mirror, the controlling depending on the current through the fourth transistor.

17. The method of claim 16, comprising controlling a respective current mirror performance of the respective second and third transistors based on a control voltage which is provided to a respective sixth transistor of the first conduction type.

18. A method for amplifying a signal, comprising:
amplifying a differential input signal to a differential current;
scaling down the differential current by a first factor;
cross-controlling the differential current by scaling up the scaled down differential current by a second factor which is different from the first factor;
providing a balancing current for influencing the differential current or the scaled down differential current; and
delivering a differential output signal depending on the differential current.

19. An amplifier stage, comprising:

a first and a second signal path, each comprising a series connection of a first transistor of a first conduction type which comprises a control input configured to receive an input signal to the amplifier stage and a second transistor of a second conduction type, the first and the second signal paths each being connected between a supply voltage tap and a reference voltage tap;

a first and a second signal output formed at a respective connection node of the respective first and second transistors in the first and second paths, respectively;

a third transistor of the second conduction type connected to the respective second transistor as a current mirror in each of the first and second paths;

a fourth transistor of the first conduction type connected to the respective first transistor as a current mirror and configured to control the third transistor of the other signal path respectively in each of the first and second paths; and a current source connected in parallel to one of the respective first, second, third and fourth transistors in each of the first and second paths, wherein the current sources comprise constant current sources, respectively, and wherein for each of the first and the second signal paths the transistors are dimensioned such that the current through the respective fifth transistor is smaller than a current through the respective third transistor by at least one order of magnitude.

* * * * *